United States Patent
Fukao et al.

(10) Patent No.: US 12,031,708 B2
(45) Date of Patent: Jul. 9, 2024

(54) ELASTIC RESIN SHEET HAVING LIGHT-DIFFUSING PORTION, AND LIGHT-EMITTING SHEET USING SAME PRELIMINARY CLASS

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Kyosuke Michigami, Hyogo (JP); Keiko Kashihara, Osaka (JP); Chihiro Horii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/376,702

(22) Filed: Oct. 4, 2023

(65) Prior Publication Data

US 2024/0027053 A1 Jan. 25, 2024

Related U.S. Application Data

(63) Continuation of application No. PCT/JP2022/017782, filed on Apr. 14, 2022.

(30) Foreign Application Priority Data

Apr. 16, 2021 (JP) .................................. 2021-069766

(51) Int. Cl.
*F21V 3/06* (2018.01)
*B29C 59/02* (2006.01)
(Continued)

(52) U.S. Cl.
CPC .............. *F21V 3/0625* (2018.02); *B32B 5/02* (2013.01); *B32B 15/14* (2013.01); *B32B 15/20* (2013.01);
(Continued)

(58) Field of Classification Search
CPC ....... F21V 3/0625; B32B 15/14; B32B 15/20; B32B 5/02; B32B 27/12; B32B 27/26;
(Continued)

(56) References Cited

U.S. PATENT DOCUMENTS

2010/0238665 A1* 9/2010 Teather .................. B32B 27/12
362/296.01
2017/0052295 A1* 2/2017 Sakuma ................. B32B 27/06
(Continued)

FOREIGN PATENT DOCUMENTS

JP   2011-022565 A   2/2011
JP   2012-163716 A   8/2012
(Continued)

OTHER PUBLICATIONS

International Search Report dated Jun. 28, 2022 issued in International Patent Application No. PCT/JP2022/017782, with English translation.

*Primary Examiner* — Thomas M Sember
(74) *Attorney, Agent, or Firm* — Rimon P.C.

(57) ABSTRACT

An elastic resin sheet that is a resin sheet formed using a resin composition containing a thermosetting resin and a curing agent, in which when a maximum height of a surface roughness on a first surface of the resin sheet is Rz1 (μm), a maximum height of a surface roughness on a second surface facing the first surface is Rz2 (μm), and a thickness is t (μm), the Rz1, the Rz2, and the thickness t (μm) satisfy relation of the following Formula (1): (Rz1+Rz2)/t≤0.5 (1), the elastic resin sheet includes a light-diffusing portion
(Continued)

having irregularities with an arithmetic mean roughness Ra of 0.3 μm or more and 5.0 μm or less on at least one of the first surface and the second surface, and the elastic resin sheet has an initial tensile modulus of 0.5 MPa or more and 500 MPa or less.

16 Claims, 2 Drawing Sheets

(51) Int. Cl.
| | |
|---|---|
| *B29L 31/00* | (2006.01) |
| *B32B 5/02* | (2006.01) |
| *B32B 15/14* | (2006.01) |
| *B32B 15/20* | (2006.01) |
| *B32B 27/12* | (2006.01) |
| *B32B 27/26* | (2006.01) |
| *B32B 27/38* | (2006.01) |
| *F21Y 115/10* | (2016.01) |

(52) U.S. Cl.
CPC .............. *B32B 27/12* (2013.01); *B32B 27/26* (2013.01); *B32B 27/38* (2013.01); *B29C 59/02* (2013.01); *B29L 2031/747* (2013.01); *B32B 2255/10* (2013.01); *B32B 2255/26* (2013.01); *B32B 2260/021* (2013.01); *B32B 2260/046* (2013.01); *B32B 2307/202* (2013.01); *B32B 2307/51* (2013.01); *B32B 2307/538* (2013.01); *B32B 2307/54* (2013.01); *B32B 2457/00* (2013.01); *F21Y 2115/10* (2016.08)

(58) Field of Classification Search
CPC .............. B32B 27/38; B32B 2260/021; B32B 2260/046; B32B 2307/202; B32B 2307/51; B32B 2307/538; B32B 2307/54; B32B 2457/00; F21Y 2115/10
See application file for complete search history.

(56) References Cited

U.S. PATENT DOCUMENTS

| | | | |
|---|---|---|---|
| 2020/0215787 A1* | 7/2020 | Fujiwara | .................. B32B 27/18 |
| 2021/0245470 A1* | 8/2021 | Maeda | ..................... B32B 27/32 |
| 2021/0379861 A1* | 12/2021 | Hayata | ............... C09K 19/2007 |

FOREIGN PATENT DOCUMENTS

| | | |
|---|---|---|
| JP | 2019-160965 A | 9/2019 |
| JP | 2019-189798 A | 10/2019 |

* cited by examiner

FIG.1

| | PATTERN 1 | PATTERN 2 | PATTERN 3 |
|---|---|---|---|
| CROSS SECTION (IN CASE OF ONE SURFACE) | | | |
| CROSS SECTION (IN CASE OF BOTH SURFACES) | | | |
| $0.3\mu m \leq Ra \leq 5.0\mu m$ | ○ | ○ | × |
| $(Rz1+Rz2)/t \leq 0.5$ | ○ | × | ○ |

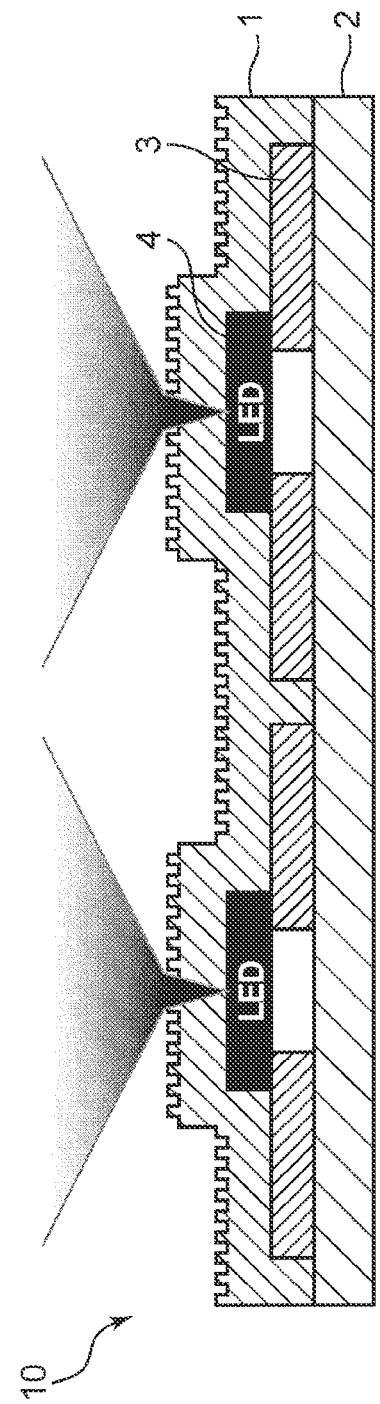

ELASTIC RESIN SHEET HAVING LIGHT-DIFFUSING PORTION, AND LIGHT-EMITTING SHEET USING SAME PRELIMINARY CLASS

CROSS-REFERENCE OF RELATED APPLICATIONS

This application is a Continuation Application of International Patent Application No. PCT/JP2022/017782, filed on Apr. 14, 2022, which in turn claims the benefit of Japanese Patent Application No. 2021-069766, filed on Apr. 16, 2021, the entire disclosures of which Applications are incorporated by reference herein.

FIELD OF INVENTION

The present invention relates to an elastic resin sheet having a light-diffusing portion and a light-emitting sheet using the same.

BACKGROUND ART

In recent years, LEDs have become mainstream in the field of lighting. LEDs are point light sources, which is a major difference of LEDs from incandescent lamps and fluorescent lamps that are lighting conventionally used. Therefore, in a case where LEDs are utilized as lighting, a light diffusing sheet having strong diffusion and a high light transmittance is required so as to eliminate the lamp image of point light sources.

As a light diffusing film for LED lighting that has rigidity and has achieved both the elimination of actual images of LED light sources and a high light transmittance, for example, Patent Literature 1 discloses a film that includes two or more sheets of transparent substrate and contains two kinds of particle groups, which are different from each other in at least one of refractive index n or weight average particle size a, together with a binder at a portion other than the outermost layer.

However, the light diffusing film described in Patent Literature 1 does not exhibit flexibility and cannot conform to irregular surfaces or cannot be applied to members having curved surfaces, so its use is limited.

Meanwhile, a conductor substrate, which is an elastic resin substrate and has irregularities (predetermined surface roughness) (Patent Literature 2), a sheet-like molding formed of an epoxy resin composition (Patent Literature 3), and the like have been reported.

However, the technology described in Patent Literature 2 is an elastic conductor substrate with improved surface stickiness, and does not take into account the diffusibility of transmitted light. The technology described in Patent Literature 3 is also a technology to be mainly used for flexible devices for interfaces, encapsulants for semiconductor encapsulation, and the like, has a low haze as a property and cannot be used as a light diffusing film.

As a recent need, there is a demand for a light diffusing film that has flexibility and heat resistance and is less likely to break during stretching, for example, in use to fabricate highly flexible light-emitting sheets by disposing LED chips and light-emitting compositions on elastic circuit boards. However, a light diffusing film that sufficiently satisfies such a need has not yet been reported.

The present invention is made in view of such circumstances, and an object thereof is to provide a light diffusing film that has flexibility and heat resistance and is less likely to break during stretching.

Patent Literature 1: JP 2012-163716 A
Patent Literature 2: JP 2019-160965 A
Patent Literature 3: JP 2019-189798 A

SUMMARY OF THE INVENTION

As a result of intensive studies, the present inventors found out that the problems can be solved by an elastic resin sheet having the following configuration, and completed the present invention by conducting further studies based on this finding.

In other words, an elastic resin sheet related to an aspect of the present invention is a resin sheet formed using a resin composition containing a thermosetting resin and a curing agent,
in which when a maximum height of a surface roughness on a first surface of the resin sheet is $Rz1$ (μm), a maximum height of a surface roughness on a second surface facing the first surface is $Rz2$ (μm), and a thickness is $t$ (μm), the $Rz1$, the $Rz2$, and the thickness $t$ (μm) satisfy relation of the following Formula (1):

$$(Rz1+Rz2)/t \leq 0.5 \qquad (1),$$

the elastic resin sheet includes a light-diffusing portion having irregularities with an arithmetic mean roughness $Ra$ of 0.3 μm or more and 5.0 μm or less on at least one of the first surface and the second surface, and
the elastic resin sheet has an initial tensile modulus of 0.5 MPa or more and 500 MPa or less.

Furthermore, the present invention also includes a light-emitting sheet having the resin sheet as a diffusing layer that flashes.

BRIEF DESCRIPTION OF THE DRAWINGS

FIG. 1 is a schematic cross-sectional view illustrating patterns of irregularities on a resin sheet according to an embodiment of the present invention and other resin sheets in comparison.

FIG. 2 is a schematic cross-sectional view illustrating an example of the configuration of a light-emitting sheet using the resin sheet of the present embodiment.

DETAILED DESCRIPTION

According to the present invention, it is possible to provide an elastic resin sheet that has flexibility and heat resistance, is less likely to break during stretching, and can be used as a light diffusing film; and a light-emitting sheet using the same. Hereinafter, embodiments according to the present invention will be specifically described with reference to drawings and the like, but the present invention is not limited thereto. In each drawing, the respective symbols denote 1 elastic resin sheet, 2 fiber sheet, 3 conductor layer, 4 LED element, and 10 light-emitting sheet.

<Elastic Resin Sheet>

The elastic resin sheet of the present embodiment is a sheet that can be elongated by 5% or more. The upper limit of elongation is not particularly limited, but 100% is sufficient. Henceforth, the elastic resin sheet of the present embodiment may be called a resin sheet.

The resin sheet of the present embodiment is an elastic resin sheet that is formed using a resin composition containing a thermosetting resin and a curing agent and has an initial tensile modulus of 0.5 MPa or more and 500 MPa or less.

By such a configuration, it is possible to obtain a resin sheet that has heat resistance, can withstand a heating process such as lamination, and is also equipped with functions as a protective film. Furthermore, the resin sheet can follow irregularities, curved surfaces, and the like, and can be suitably used as a light diffusing film, a protective film, and the like for lighting members of various shapes.

In the present embodiment, the initial tensile modulus means the modulus calculated from the stresses at 1% and 5% elongation when the sheet is elongated by 5%.

It is not preferable that the initial tensile modulus is less than 0.5 MPa since there is a defect that the resin sheet is inferior in restoring force and does not return to its original shape. It is not preferable that the initial tensile modulus exceeds 500 MPa since there is a defect that the resin sheet is inferior in elasticity and is likely to break. A more preferable initial tensile modulus of the resin sheet is 1.0 MPa or more and 50 MPa or less.

The initial tensile modulus in the present embodiment can be measured by a method shown in Examples to be described later.

As described above, the resin sheet of the present embodiment is a sheet formed using a resin composition containing a thermosetting resin and a curing agent, but may be a sheet (film) formed of a cured product (so-called C stage) of the resin composition, or may be a resin sheet in which the resin composition is in an uncured (so-called A stage) or semi-cured (so-called B stage) state.

In the resin sheet of the present embodiment, when the maximum height of the surface roughness on the first surface of the resin sheet is Rz1 (μm), the maximum height of the surface roughness on the second surface facing the first surface is Rz2 (μm), and the thickness is t (μm), the Rz1, the Rz2, and the thickness t (μm) satisfy the relation of the following Formula (1):

$$(Rz1+Rz2)/t \leq 0.5 \qquad (1)$$

By such a configuration, it is possible to obtain a resin sheet that is less likely to break when stretched as well.

In the present embodiment, the maximum height (Rz) of the surface roughness is a value measured using a laser microscope ("OLS3000" manufactured by Olympus Corporation).

The thickness t of the resin sheet in Formula (1) means the thickness including the irregularities of the sheet surface as illustrated in FIG. 1.

The resin sheet of the present embodiment includes a light-diffusing portion having irregularities, and can be suitably used as a light diffusing film. More specifically, the light-diffusing portion has irregularities with an arithmetic mean roughness Ra of 0.3 μm or more and 5.0 μm or less on at least one of the first surface and the second surface. By having such a configuration, excellent light diffusibility can be exerted. A more preferable range of the arithmetic mean roughness Ra is 0.5 μm or more and 5.0 μm or less. The shape of the irregularities is not particularly limited, and may be square or round. The combination of the shape of the concave portion and the shape of the convex portion is also not particularly limited, and may be a combination of square shapes, a combination of round shapes, or a combination of a round shape and a square shape.

In the present embodiment, the surface roughness (arithmetic mean roughness Ra) is a value measured using a laser microscope ("OLS3000" manufactured by Olympus Corporation).

In the resin sheet of the present embodiment, the first surface and the second surface are in the relation of facing each other, this indicates that the other is the back surface when one is the front surface, and which of the first surface and the second surface is the front surface is not particularly limited. However, in order to acquire excellent light diffusibility, it is preferable that the surface on which the light-diffusing portion is present is the front surface (the outer side that is not in contact with the light source such as LED).

In other words, it is preferable that the resin sheet of the present embodiment includes a light-diffusing portion as described above on at least the front surface (outer side). The surface roughness on the inner side that is in contact with the light source such as LED and is the opposite side of the outer side is not particularly limited, and may have a surface roughness similar to that of the front surface, but it is desirable that the arithmetic mean roughness Ra of the resin sheet on the side in contact with the light source is about 0.0 μm or more and 0.5 μm or less from the viewpoint of adhesive properties. In this specification, an arithmetic mean roughness Ra of 0.04 μm or less is regarded to be 0.0 μm.

As described above, the light-diffusing portion of the resin sheet of the present embodiment has a shape as illustrated in Pattern 1 in FIG. 1. The shape pattern in FIG. 1 is merely an example, and the present invention is not limited to this.

The upper part of FIG. 1 shows a case where one (that is, one surface) of the first surface and the second surface of the resin sheet has surface roughness, and the lower part of FIG. 1 shows a pattern in a case where both (that is, both surfaces) of the first surface and the second surface of the resin sheet have surface roughness.

Pattern 1 satisfies Formula (1) and also has irregularities satisfying the stipulation for the arithmetic mean roughness Ra in the case of one surface as well as the case of both surfaces, but Pattern 2 is not preferable since the stipulation of Formula (1) is not satisfied and the sheet is likely to break during stretching. Pattern 3 is not preferable since the irregularities do not satisfy the stipulation for the arithmetic mean roughness Ra and the transmittance of the light source is low although Formula (1) is satisfied.

In the resin sheet of the present embodiment, it is possible to suppress breakage in a case where the sheet is stretched while maintaining a sufficient light diffusivity by equipping a light-diffusing portion that satisfies both of the stipulations as Pattern 1.

Furthermore, in the resin sheet of the present embodiment, it is preferable that the average length RSm of the roughness curve elements in the irregularities of the light-diffusing portion is 1.0 μm or more and 100 μm or less.

It is considered that this makes it possible to diminish the period of the irregularities in the light-diffusing portion and achieve a higher light diffusivity. A more preferable range of RSm is 1.0 μm or more and 10 μm or less.

In the present embodiment, the RSm is a value measured using a laser microscope ("OLS3000" manufactured by Olympus Corporation).

The thickness of the resin sheet of the present embodiment is not particularly limited, but is preferably about 10 μm or more and 200 μm or less, more preferably about 30 μm or more and 150 μm or less in the case of uncured and semi-cured resin sheets from the viewpoint of elasticity and ease of handling during lamination. In a case where the resin sheet is a cured film obtained by performing heating/drying, the thickness is preferably about 10 µm or more and 200 µm or less, more preferably about 30 µm or more and 150 µm or less.

The composition of the resin composition used for the resin sheet of the present embodiment is not particularly limited as long as the resin composition is a resin composition containing a thermosetting resin and a curing agent.

For example, the resin composition of the present embodiment preferably contains a polyrotaxane resin and an epoxy resin as a thermosetting resin, and it is particularly desirable that the resin composition contains at least an epoxy resin. This makes it possible to obtain a resin sheet that has sufficient heat resistance and can withstand heat when lamination and the like are performed.

One of more specific embodiments includes, for example, a resin composition containing an epoxy resin and a curing agent, and a resin composition containing polyrotaxane, a thermosetting resin, and a curing agent. Hereinafter, the respective components will be described more specifically.

Next, in the case of a resin composition containing polyrotaxane, a thermosetting resin, and a curing agent, specifically, examples of polyrotaxane include polyrotaxanes as described in Japanese Patent No. 4482633 or WO 2015/052853. A commercially available one may be used, and specifically, SeRM Super Polymer A1000, SH3400P, and the like manufactured by ASM Inc. can be used.

Examples of the thermosetting resin include, without particular limitation, thermosetting resins such as epoxy resins, phenol resins, polyimide resins, urea resins, melamine resins, unsaturated polyesters, and urethane resins. Among these, it is preferable to use epoxy resins.

Specifically, examples of the epoxy resins include bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, dicyclopentadiene type epoxy resin, an epoxidized product of a condensate of a phenol and an aromatic aldehyde having a phenolic hydroxyl group, triglycidyl isocyanurate, and alicyclic type epoxy resin. These may be used singly or in combination of two or more kinds thereof depending on the situation.

As the epoxy resin, more preferably, for example, an epoxy resin, which contains two or more epoxy groups in one molecule and has a molecular weight of 500 or more, is suitably exemplified. As such an epoxy resin, a commercially available one may be used, and examples thereof include JER1003 (manufactured by Mitsubishi Chemical Corporation, molecular weight 1300, bifunctional), EXA-4816 (manufactured by DIC, molecular weight 824, bifunctional), YP50 (manufactured by NIPPON STEEL Chemical & Material Co., Ltd., molecular weight 60,000 to 80,000, bifunctional), and PMS-14-67 (manufactured by Nagase ChemteX Corporation, molecular weight 300,000, multifunctional).

One kind of epoxy resin as described above may be used singly, or two or more kinds may be used concurrently.

In any resin composition, the curing agent is not particularly limited as long as it functions as a curing agent for thermosetting resins as described above. In particular, phenol resins, amine-based compounds, acid anhydrides, imidazole-based compounds, sulfide resins, dicyandiamide, and the like may be mentioned as examples that can be preferably used as curing agents for epoxy resins. A light/ultraviolet curing agent, a thermal cationic curing agent and the like can also be used. These may be used singly or in combination of two or more kinds thereof depending on the situation. The resin composition may contain a curing accelerator, if necessary. Examples of the curing accelerator include imidazole-based compounds.

In a case where the resin composition used for the resin layer in the present embodiment is a resin composition containing polyrotaxane, a cross-linking agent may be further added. As such a cross-linking agent, any one can be used without particular limitation as long as it can form a structure that crosslinks with at least part of the cyclic molecule of the polyrotaxane (at least one reactive group of the cyclic molecule of the polyrotaxane). Specifically, examples thereof include isocyanates and cyanuric chloride.

The proportion of each component in the resin composition is not particularly limited as long as the effects of the present invention can be exerted, but for example, in a case where the resin composition contains polyrotaxane, a thermosetting resin, and a curing agent, the proportion of polyrotaxane is 10 to 80 parts by mass, more preferably about 30 to 50 parts by mass; the proportion of thermosetting resin is 10 to 89.9 parts by mass, more preferably 30 to 50 parts by mass; and the proportion of curing agent is 0.1 to 30 parts by mass, more preferably 0.1 to 20 parts by mass assuming that the sum of the polyrotaxane, thermosetting resin, and curing agent is 100 parts by mass.

In a case where the resin composition contains an epoxy resin and a curing agent and does not contain polyrotaxane, the proportion of epoxy resin is 50 to 99 parts by mass, more preferably about 60 to 80 parts by mass; and the proportion of curing agent is 1 to 50 parts by mass, more preferably about 1 to 40 parts by mass assuming that the total amount of the resin composition is 100 parts by mass.

Furthermore, the resin composition according to the present embodiment may contain other additives, for example, curing catalysts (curing accelerators), colorants, inorganic fine particles, ultraviolet absorbers, flame retardants, flame retardant promoters, and leveling agents, if necessary, in a range in which the effects of the present invention are not impaired.

In a case where the resin composition contains the curing accelerator, the curing accelerator is not particularly limited as long as it can accelerate the curing reaction of the resin composition of the present embodiment. Specifically, examples thereof include metal oxides, azo compounds, peroxides, imidazole compounds, phosphorus-based curing accelerators, and amine-based curing accelerators. In a case where the resin composition of the present embodiment contains a curing accelerator, the content of the curing accelerator is preferably 0.01 to 5.0 parts by mass, more preferably 0.01 to 3 parts by mass based on 100 parts by mass of the resin components (resin+curing agent).

It is particularly preferable to contain a colorant since the resin sheet can be decorated and the design is improved. Examples of usable colorants include dyes and pigments. In a case where the colorant is contained, the content thereof is preferably 0.1 parts by mass or more and 5.0 parts by mass or less with respect to 100 parts by mass of the resin components (resin+curing agent).

By further blending inorganic fine particles, the light diffusivity can be improved. Examples of usable inorganic fine particles include silica, alumina, titanium oxide, barium titanate, magnesium titanate, calcium titanate, strontium titanate, zinc oxide, tin oxide, silica sand, clay, mica, wollastonite, diatomaceous earth, chromium oxide, cerium oxide, red iron oxide, antimony trioxide, magnesium oxide, zirconium oxide, barium sulfate, barium carbonate, calcium carbonate, silicon carbide, and silicon nitride.

The inorganic fine particles used in the present embodiment preferably have an average particle size of 0.01 μm or more and 100 μm or less from the viewpoint that the light diffusivity can be further improved.

In a case where the inorganic fine particles are contained, the content thereof is preferably 0.1 parts by mass or more and 10 parts by mass or less with respect to 100 parts by mass of the resin components (resin+curing agent). It is not desirable that the content of the inorganic fine particles is too high since the resin sheet is likely to break.

As the resin composition of the present embodiment contains an ultraviolet absorber, there is an advantage that deterioration (yellowing) of the sheet due to ultraviolet light can be suppressed. Examples of usable ultraviolet absorbers include ultraviolet absorbers containing benzotriazole derivatives, benzophenone derivatives, benzoate derivatives, triazine derivatives, benzothiazole derivatives, and benzoyl methane.

In a case where the ultraviolet absorber is contained, the content thereof is preferably 0.1 parts by mass or more and 1.0 parts by mass or less with respect to 100 parts by mass of the resin components (resin+curing agent).

The method for preparing the resin composition of the present embodiment is not particularly limited, and for example, a resin varnish containing the resin composition of the present embodiment can be first obtained by uniformly mixing a thermosetting resin such as epoxy resin, organic components such as a curing agent and a cross-linking agent, and a solvent. The solvent to be used is not particularly limited, and for example, toluene, xylene, methyl ethyl ketone, and acetone can be used. These solvents may be used singly or in combination of two or more kinds thereof. If necessary, an organic solvent for adjusting the viscosity and various additives may be blended.

The method for imparting a shape (irregularities) as described above to the resin sheet of the present embodiment is not particularly limited, but examples thereof include a method in which a resin varnish is applied to the irregular transfer substrate, the organic solvent is decreased or removed through heating, the resin varnish is cured through further heating, and then the substrate is peeled off. Examples of such a transfer substrate include a release sheet.

Specifically, a resin varnish containing the resin composition is first applied to a substrate such as a release sheet having desired irregularities. The application method is not particularly limited, but includes, for example, a bar coater, a comma coater, a die coater, a roll coater, and a gravure coater.

After the resin varnish is applied, the organic solvent can be volatilized from the resin layer (A stage) containing the resin composition containing an organic solvent before being cured through heating to decrease or remove the organic solvent. The release sheet coated with the resin composition (resin varnish) is heated under desired heating conditions, for example, at 60° C. to 80° C. for 1 to 120 minutes to obtain a resin layer, from which the organic solvent is decreased or removed, in an uncured or semi-cured (B stage) state. In the present embodiment, the B stage of the resin composition, that is, the uncured state (uncured product) or semi-cured state (semi-cured product) is a state in which the resin composition can be further cured. For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The resin layer can also be cured through further heating. A fiber layer coated or impregnated with a resin composition (resin varnish) is heated under desired heating conditions, for example, at 80° C. to 200° C. for 1 to 120 minutes to obtain a resin layer in a cured state (C stage). In the present embodiment, the C stage of the resin composition, that is, the cured state (cured product) refers to a state in which the curing reaction has proceeded and the resin has been cross-linked so that the resin does not melt even when heated.

After that, the release sheet is peeled off to obtain the resin sheet of the present embodiment.

In addition to the above, irregularities can also be imparted by a method in which the uncured or semi-cured resin composition is subjected to hot compression molding using an irregular transfer substrate, a desired irregular pattern is transferred, and then the substrate is peeled off, a method in which hot compression molding is performed using a nanoimprint mold, and a method in which irregularities are imparted to the resin composition surface using a laser processing machine.

In a case where the resin sheet of the present embodiment is in an uncured or semi-cured state, and the like, a protective film and/or a support may be laminated, if necessary. As the support, for example, a polyethylene film such as polyethylene terephthalate (PET) can be used. A similar film can be used as the protective film as well.

<Light-Emitting Sheet>

Next, the basic configuration of the light-emitting sheet of the present embodiment will be described.

As illustrated in FIG. 2, a light-emitting sheet 10 of the present embodiment includes a light diffusing layer 1, a fiber sheet 2, a conductor layer 3, and an LED element 4, and the light diffusing layer 1 is formed of the resin sheet of the present embodiment described above. Specifically, the light-emitting sheet 10 is a light-emitting sheet 10 including a fiber sheet 2; a conductor layer 3 laminated on the fiber sheet 2; an LED (LED element) 4 electrically connected to the conductor layer 3; and a light diffusing layer 1 that is formed of a resin sheet as described above and covers the LED 4.

By such a configuration, it is possible to provide a light-emitting sheet that is flexible, resistant to breakage, and equipped with excellent light diffusibility.

(Fiber Sheet)

It is preferable that the fiber sheet 2 according to the present embodiment includes a fiber layer and a resin layer, can be elongated by 1% or more, and has an initial tensile modulus of 1 MPa or more and 10 GPa or less.

In the light-emitting sheet of the present embodiment, the initial tensile modulus is synonymous with that mentioned in the elastic resin sheet described above.

It is not preferable that the initial tensile modulus is less than 1 MPa since there is a defect that the light-emitting sheet is inferior in restoring force and does not return to its original shape. It is not preferable that the initial tensile modulus exceeds 10 GPa since there is a defect that the light-emitting sheet is inferior in elasticity and it is not comfortable to wear, for example, in a case where the light-emitting sheet of the present embodiment is used for clothing and the like. The initial tensile modulus of the fiber sheet is more preferably 5 MPa or more and 1 GPa or less, still more preferably 5 MPa or more and 500 MPa or less.

The initial tensile modulus in the present embodiment can be measured by a method similar to that in the elastic resin sheet described above.

(Resin Layer in Fiber Sheet)

The resin layer in the fiber sheet is not particularly limited as long as the initial tensile modulus of the fiber sheet is in the above range. For example, a thermosetting resin that is generally used as an elastic insulating layer of an electronic substrate can be used as the resin layer of the present embodiment. The resin layer in the present embodiment preferably contains a thermosetting resin, and it is considered that the resin layer thus exhibits high heat resistance and is less likely to undergo melting and thermal decomposition in a high temperature atmosphere as well. As the resin layer is equipped with heat resistance, there is an advantage that various LED elements can be mounted with solder. It is possible to suppress the deformation/degeneration of the fiber sheet due to the heat generated by the LED.

In the fiber sheet 2 of the present embodiment, the resin layer may be formed on the entire surface of one side or both sides of the fiber layer, but is only required to be formed on the surface of at least part of at least one side of the fiber layer.

Furthermore, the fiber layer may be impregnated with the resin layer. At least part of one side of the fiber layer may be impregnated with part of the resin layer instead of the entire resin layer.

In particular, in a case where the fiber layer is impregnated with at least part of the resin layer, it is considered that the resin layer and the fiber layer are further integrated and breakage and the like are less likely to occur.

In the fiber sheet of the present embodiment, the thickness of the resin layer is not particularly limited, and can be appropriately set depending on the use, and for example, a thickness of 50 μm to 5000 μm is preferable from the viewpoint of handleability, optical properties, and mounting properties.

Preferably, the thermosetting resin of the present embodiment contains at least an epoxy resin. It is considered that heat resistance can be thus acquired more reliably.

It is preferable that the thermosetting resin and the resin layer have a glass transition temperature of 60° C. or less. This makes it possible to further impart flexibility to the fiber sheet. It is not particularly necessary to set a lower limit value of the glass transition temperature, but the lower limit is preferably −40° C. or more in order to avoid stickiness at normal temperature.

It is preferable that the thermosetting resin can be elongated by 1% or more. This makes it possible to elongate the fiber sheet by 1% or more. The thermosetting resin preferably has an initial tensile modulus of 1 MPa or more and 10 GPa or less. Thus, the fiber sheet has an initial tensile modulus of 1 MPa or more and 10 GPa or less.

The composition of the resin composition used for the resin layer of the present embodiment is not particularly limited as long as the resin composition is equipped with properties as described above.

For example, the resin composition of the present embodiment preferably contains a polyrotaxane resin and an epoxy resin as a thermosetting resin, and it is particularly desirable that the resin composition contains an epoxy resin. The resin composition preferably further contains a curing agent. This makes it possible to obtain a fiber sheet that has sufficient heat resistance and can withstand heat during component mounting in a reflow process. It becomes easy to integrate the resin layer with the fiber layer by bonding the uncured resin composition to the fiber layer and then performing curing. Preferably, as the resin composition used for the resin layer of the fiber sheet of the present embodiment, a resin composition similar to the resin composition used for the elastic resin sheet described above can be used.

Furthermore, the resin composition according to the present embodiment may contain other additives, for example, curing catalysts (curing accelerators), flame retardants, flame retardant promoters, leveling agents, and colorants, if necessary, in a range in which the effects of the present invention are not impaired.

The method for preparing the resin composition of the present embodiment is not particularly limited, and for example, the resin composition of the present embodiment can be first obtained by uniformly mixing an epoxy resin, a curing agent, a cross-linking agent, a thermosetting resin and a solvent. The solvent to be used is not particularly limited, and for example, toluene, xylene, methyl ethyl ketone, and acetone can be used. These solvents may be used singly or in combination of two or more kinds thereof. If necessary, an organic solvent for adjusting the viscosity and various additives may be blended.

In the fiber sheet of the present embodiment, the resin layer is formed by, for example, immersing a fiber layer to be described later in a resin composition as described above, applying the resin composition to the fiber layer, or bonding the film-like resin composition to the fiber layer. The application method of the resin composition is not particularly limited, but includes, for example, a bar coater, a comma coater, a die coater, a roll coater, and a gravure coater.

After the resin varnish is applied or impregnated, the organic solvent can be volatilized from the resin layer (A stage) containing the resin composition containing an organic solvent before being cured through heating to decrease or remove the organic solvent. The fiber layer coated or impregnated with a resin composition (resin varnish) is heated under desired heating conditions to obtain a resin layer, from which the organic solvent has been decreased or removed, in an uncured or semi-cured (B stage) state. The resin layer can also be cured through further heating.

In a case where the film-like resin composition is bonded to the fiber layer, for example, the resin composition is applied to a desired plastic film, a metal foil, or the like in advance to obtain a resin layer containing a resin composition containing an organic solvent before being cured (A-stage) or heating is then performed under desired heating conditions, for example, at 80° C. to 120° C. for 1 to 120 minutes to obtain a resin layer in an uncured or semi-cured (B stage) state. This is bonded to a fiber layer and fixed to the fiber layer by applying external energy such as pressure and heat to obtain the fiber sheet. The resin layer may be a resin layer in an uncured or semi-cured (B stage) state, or may be a resin layer in a cured state (C stage) by further curing the resin layer through heating.

(Fiber Layer in Fiber Sheet)

The fiber layer in the fiber sheet is not particularly limited, but for example, a fiber layer formed of a woven fabric, a knitted fabric, a braided fabric, a non-woven fabric, or a combination thereof can be used. The fiber layer may be a unidirectional woven fabric. Thus, there is an advantage that a fiber sheet exhibiting elasticity only in a desired direction can be obtained.

In the fiber layer, the woven fabric, knitted fabric, braided fabric, non-woven fabric, or the like described above is preferably formed of vegetable fibers, animal fibers, synthetic fibers, semi-synthetic fibers, regenerated fibers, inorganic fibers, or a combination thereof.

Since it is desirable that the fiber sheet of the present embodiment is equipped with elasticity, it is desirable that the fiber layer is also equipped with certain degrees of elasticity and extensibility. Specifically, the fiber layer is only required to be a fiber layer so that the initial tensile modulus of the fiber sheet is 1 MPa or more and 1 GPa or less. For example, the modulus of the fiber layer is preferably about 0.01 MPa to 1 GPa, and the elongation rate is preferably about 1% or more and 1000% or less, more preferably 5% or more and 1000% or less. In other words, the fiber layer of the present embodiment does not contain a substrate such as a glass cloth that has little extensibility.

More specifically, the fibers used in the fiber layer of the present embodiment include fibers generally used as fabrics. In other words, examples of plant fibers include seed hair fibers such as cotton and kapok, bark fibers of linseed, hemp, china grass, jute, paper-bush, paper mulberry and the like, and leaf fibers of manila hemp, sisal hemp and the like. Examples of animal fibers include wool, angora, cashmere, mohair, camel, alpaca, and silk. Animal fibers may include leather, and include mammals such as cows, pigs, horses, sheep and goats, reptiles such as crocodiles and snakes, birds such as ostriches, and fish such as sharks. Examples of synthetic fibers include nylon fibers, aramid fibers, vinylon fibers, polyvinylidene chloride-based synthetic fibers, polyvinyl chloride-based synthetic fibers, polyester-based synthetic fibers, polyacrylonitrile-based synthetic fibers, polyethylene-based synthetic fibers, polypropylene-based synthetic fibers, polyurethane-based synthetic fibers, and polylactic acid fibers. Synthetic fibers may include artificial leather and synthetic leather. Examples of semi-synthetic fibers include acetate fibers and the like. Examples of regenerated fibers include viscose fibers and cuprammonium fibers. Examples of inorganic fibers include glass fibers, carbon fibers, and metal fibers.

For example, in a case where the light-emitting sheet of the present embodiment is used for wearing, fabrics used for clothing can also be used as the fibers for the fiber layer. Alternatively, the fibers may be, for example, cloth used for tents, truck beds, and the like. This also makes it possible to integrate cloth and various LED elements into the cloth used in various situations.

In the fiber sheet of the present embodiment, the thickness of the fiber layer is not particularly limited, and can be appropriately set depending on the use, and for example, a thickness of 50 μm to 5000 μm is preferable from the viewpoint of elasticity and handleability.

(Conductor Layer)

The light-emitting sheet of the present embodiment includes a conductor layer 3. In FIG. 2, the conductor layer 3 is provided on one surface of the fiber sheet 2, but is not limited to this, and the conductor layer may be equipped on both surfaces of the light-emitting sheet or inside the light-emitting sheet. Examples of the conductor layer include wiring formed of a metal foil and a conductive composition, an extremely thinly coated conductor layer, a conductive thread, and a metal molding.

In the light-emitting sheet of the present embodiment, the conductor layer 3 serves as a control circuit for sending a signal for controlling the LED element 4 to be described later from LED control means (not illustrated), a voltage application circuit from power supply means (not illustrated), a transmission circuit for control information sent from a smartphone, a personal computer (PC), or the like by wireless communication means (not illustrated), and the like.

Metal Foil

The metal foil is not particularly limited, and examples thereof include copper foil (plating), aluminum foil, and stainless steel foil, and these metal foils may be metal foils subjected to surface treatment with a silane coupling agent and the like.

In a case of forming a conductor layer using a metal foil, one or a plurality of the fiber sheets described above are stacked, a metal foil such as copper foil is further stacked on part or entire surface of both or one of upper and lower surfaces of the stacked body, and this is laminated and integrated by hot press molding, whereby a double-sided metal foil clad or single-sided metal foil clad laminate can be fabricated. Alternatively, one or a plurality of fiber sheets are stacked, a metal foil such as copper foil coated with a resin layer is further stacked on part or entire surface of both or one of upper and lower surfaces of the stacked body, and this is laminated and integrated by hot press molding, whereby a double-sided metal foil clad or single-sided metal foil clad laminate can be fabricated. Alternatively, one or a plurality of fiber layers not containing a resin layer are stacked, a metal foil such as copper foil coated with a resin layer is further stacked on part or entire surface of both or one of upper and lower surfaces of the stacked body, and this is laminated and integrated by hot press molding, whereby a double-sided metal foil clad or single-sided metal foil clad laminate can be fabricated. After that, a circuit (wiring) is formed by subjecting the metal foil to etching and the like, whereby a conductor layer (wiring) as a circuit can be provided on the surface of the laminate containing a fiber sheet as described above. In a case where a circuit is formed by subjecting the metal foil to etching, it is preferable to mask the fiber layer so that the fiber layer is not immersed in the etchant. For example, the conductor layer can be fabricated by the following procedure. An opening is provided in a desired shape in, for example, a solvent-resistant plastic film such as polyimide as a cover film, and a single-sided metal foil clad resin layer is pasted so as to cover the opening. When this is laminated and integrated together with the fiber layer by hot press molding, only the opening is impregnated with the fiber layer. This laminate is pasted to a plastic plate with tape or the like so that the fiber layer does not come into contact with the etchant, and etching is performed. Finally, as the cover film is cut off along the boundary of the opening, the resin layer is provided in the shape of the aforementioned opening, and a circuit of metal foil is formed on the surface thereof.

Examples of the circuit forming method include circuit formation by a semi additive process (SAP) or a modified semi additive process (MSAP) in addition to the method described above. As these are further laminated using a resin layer in an uncured or semi-cured state or a fiber sheet containing the resin layer, a laminate incorporated with a conductor layer can be fabricated.

In a case where a copper foil is further used as a conductor layer in the light-emitting sheet of the present embodiment, heat resistance is exhibited and further solder wettability becomes favorable, and it is thus possible to mount components (LED elements and the like) by the reflow process and provide fabric devices and the like exhibiting high operational reliability. It is also possible to mount LED elements on both surfaces by various means, or to further incorporate mounted LED elements.

Conductive Composition

The conductor layer of the present embodiment may be formed of a conductive composition. The conductive composition of the present embodiment is preferably a conductive composition exhibiting elasticity. This makes it possible to obtain a fabric device and the like that do not hinder the extensibility and elasticity of the fiber sheet and exhibit excellent operational reliability. An example of a conductive composition exhibiting elasticity will be specifically shown below.

Specifically, examples of the conductive composition include a resin composition or the like, which contains a resin that serves as an elastic binder, a curing agent that reacts with the resin, and a conductive filler, and in which the resin has a functional group with a functional group equivalent weight of 400 g/eq or more and 10000 g/eq or less, cured products of the resin and the conductive composition have a glass transition temperature (Tg) or softening point of 40° C. or less or a modulus of less than 1.0 GPa at 30° C., and the conductive filler (F) contains a conductive substance having an intrinsic volume resistivity of $1\times10^{-4}$ Ω·cm or less at room temperature. Examples of the functional group include an epoxy group, a vinyl group, a (meth)acryloyl group, a hydroxyl group, a carboxyl group, an amino group, an alkoxy group, and a carbonyl group.

The respective components will be described below.

Specific examples of the resin preferably include epoxy-modified (meth)acrylic acid esters, hydroxyl group-modified (meth)acrylic acid esters, and carboxyl group-modified (meth)acrylic acid esters.

In the present embodiment, the resin preferably has a weight average molecular weight of 50,000 or more. It is considered that this makes it difficult to cause bleeding when a conductive pattern is printed using the conductive composition of the present embodiment. Meanwhile, the upper limit value of the weight average molecular weight is not particularly limited, but since the viscosity may increase and handleability may decrease in a case where the molecular weight exceeds 3,000,000, and the weight average molecular weight range of the resin is preferably 50,000 or more and 3,000,000 or less, more preferably 100,000 or more and 1,000,000 or less.

As the curing agent, various curing agents can be used without particular limitation as long as they exhibit reactivity with resins as described above. Specific examples of the curing agent include imidazole-based compounds, amine-based compounds, phenol-based compounds, acid anhydride-based compounds, isocyanate-based compounds, mercapto-based compounds, onium salts, radical generators such as peroxides, and photoacid generators.

The conductive filler contains a conductive substance having an intrinsic volume resistivity of $1\times10^{-4}$ Ω·cm or less at room temperature. In a case of using a material having an intrinsic volume resistivity of more than $1\times10^{-4}$ Ω·cm at room temperature, the volume resistivity also depends on the blended amount but is approximately $1\times10^{-3}$ Ω·cm to $1\times10^{-2}$ Ω·cm when a conductive composition is prepared using the material. Therefore, when a circuit is formed using the conductive composition, the resistance value is high and the power loss is large.

Examples of the conductive substance (conductive substance having an intrinsic volume resistivity of $1\times10^{-4}$ Ω·cm or less at room temperature) include simple substances composed of metal elements such as silver, copper, and gold; and compounds such as oxides, nitrides, carbides and alloys containing these elements. In addition to the conductive filler (F), a conductive or semi-conductive auxiliary conducting agent may also be added to the conductive composition for the purpose of further improving the conductivity. As such a conductive or semi-conductive auxiliary, conductive polymers, ionic liquids, carbon black, acetylene black, carbon nanotubes, inorganic compounds used in antistatic agents, and the like can be used, and one kind may be used or two or more kinds may be used at the same time.

The shape of the conductive filler is preferably a flat shape, and the aspect ratio between the thickness and the in-plane longitudinal direction is preferably 10 or more. In a case where the aspect ratio is 10 or more, the surface area to the mass ratio of the conductive filler increases and the efficiency of conductivity increases as well as there is an effect of improving adhesiveness to the resin components and improving elasticity. From the viewpoint that more favorable conductivity and printability can be secured when the aspect ratio is 1000 or less, the aspect ratio is preferably 10 or more and 1000 or less, more preferably 20 or more and 500 or less. Examples of conductive fillers having such an aspect ratio include conductive fillers having a tap density of 6.0 g/cm$^3$ or less as measured by a tap method. It is more preferable that the tap density is 2.0 g/cm$^3$ or less since the aspect ratio further increases.

With regard to the proportion of the conductive filler blended in the conductive composition, the proportion of the conductive filler blended is preferably 40% to 95% by mass, more preferably 60% to 85% by mass with respect to the total amount of the conductive composition in terms of mass ratio from the viewpoint of conductivity, cost and printability.

The particle size of the conductive filler used in the present embodiment is not particularly limited, but the average particle size (particle size at 50% cumulative volume; D50) measured by a laser light scattering method is preferably 0.5 μm or more and 30 μm or less, more preferably 1.5 μm or more and 20 μm or less from the viewpoint of exhibiting printability during screen printing and an adequate viscosity during kneading of the mixture.

In addition to the components described above, additives and the like can be added to the conductive composition according to the purpose. Examples of the additives include elastomers, surfactants, dispersants, colorants, perfuming agents, plasticizers, pH adjusters, viscosity adjusters, ultraviolet absorbers, antioxidants, and lubricants.

Conductor Layer Using Conductive Composition

By applying or printing the conductive composition of the present embodiment on the resin layer of a fiber sheet as described above, a coating film of the conductive composition can be formed and a conductor layer such as desired wiring (conductive pattern) can be formed.

The step of applying the conductive composition of the present embodiment onto a substrate is not particularly limited, but for example, coating methods using an applicator, a wire bar, a comma roll, a gravure roll and the like; and printing methods using screen, flat plate offset, flexography, inkjet, stamping, dispenser, squeegee and the like can be used.

A conductor layer may be formed inside the fiber sheet.

(LED Element)

The LED element 4 used in the present embodiment is not particularly limited as long as it emits light, and a proper LED element can be appropriately selected depending on the use of the light-emitting sheet. Specifically, the LED element of the present embodiment may be an LED element that emits at least one selected from visible light, ultraviolet light, or infrared light. It is possible to appropriately select the kind of light emitted by the LED element, the size, number, color, arrangement, and permutation of the LED element, and the like depending on the use, for example, the kind of light emitted by the LED element is visible light in a case where the light-emitting sheet is used in display devices and the like, ultraviolet light in a case where the light-emitting sheet is used in sterilization devices, deodorization devices, and the like, and infrared light in a case where the light-emitting sheet is used in security systems, rangefinders, signal transmitters, and the like. Different kinds of LED elements may be combined, for example, ON/OFF of an invisible light LED is displayed with visible light.

As illustrated in FIG. 1, in the present embodiment, the LED element 4 is disposed on the conductor layer 3, and can emit light by, for example, current flowing through the conductor layer 3 from a power supply means to be described later or the like.

(Light Diffusing Layer)

The light diffusing layer 1 in the light-emitting sheet 10 of the present embodiment is formed of the resin sheet of the present embodiment described above. The resin sheet of the present embodiment has flexibility, so can cover the LED element following the irregularities and exerts excellent light diffusibility in a configuration as illustrated in FIG. 2 as well. The resin sheet is also excellent in heat resistance, and is highly resistant to the heat of LED elements.

(Other Electronic Components)

The light-emitting sheet of the present embodiment may further include electronic components other than the LED element. Electronic components that can be mounted are not particularly limited, and examples thereof include general passive elements, active elements, integrated circuits, displays, motors, speakers, piezoelectric elements, switches, fuses, antennas, heat sinks, acceleration sensors, temperature sensors, humidity sensors, optical sensors, ultrasonic sensors, pH sensors, gas sensors, motion sensors, angle sensors, magnetic sensors, gyro sensors, pressure sensors, orientation sensors, radiation sensors, sound sensors, and GPS receivers.

(Method for Fabricating Light-Emitting Sheet)

The light-emitting sheet of the present embodiment is obtained by, for example, providing a conductor layer and an LED element as described above and, if necessary, LED control means on a fiber sheet formed by immersing the fiber layer in a thermosetting resin composition constituting a resin layer as described above, coating a fiber layer with the resin composition, or bonding the film-like resin composition to a fiber layer, and further laminating a resin sheet as described above thereon.

The mounting method for installing an LED element on the conductor layer is not particularly limited, and examples thereof include a method using soldering iron, and a method in which various cream solders are printed, then LED elements are mounted using various component mounting apparatuses, and mounting is performed using various reflow apparatuses. In particular, considering the heat resistance of the fiber layer, it is preferable to use means for heating only the metal portion by induction heating, microwaves, and the like.

The method of providing a light diffusing layer on an LED element is also not particularly limited, and for example, the light diffusing layer can be formed by laminating the resin sheet described above on the fiber sheet 2, the conductor layer 3, and the LED element 4 so that the light-diffusing portion of the resin sheet overlaps the LED element.

(Use)

The light-emitting sheet of the present embodiment can be applied to various uses that require mounting properties and shape following properties and high heat resistance. Specifically, the light-emitting sheet can be used in, for example, display devices, sterilization devices, clothing, and clothing ornaments.

Hereinafter, the present invention will be described more specifically with reference to Examples, but the scope of the present invention is not limited to these.

EXAMPLES

First, all kinds of materials used in the present Examples are as follows.

(Epoxy Resin)

Epoxy Resin 1 Acrylonitrile as a polymerization unit (a), isobornyl acrylate as a polymerization unit (b), and a polymerization unit (c) represented by the following Formula (1) were polymerized so that the proportion (% by polymerization) of (a):(b):(c) blended was 10:20:70, and glycidyl methacrylate as a polymerization unit (d) was further added so that the epoxy equivalent weight thereof with respect to the total amount of acrylic resin was the numerical value presented in Table 1. After that, the mixture was subjected to the polymerization reaction to obtain acrylic resin 1 containing methyl ethyl ketone as a solvent ("PMS-14-67EK40" manufactured by Nagase ChemteX Corporation). The solid ratio was 40% by weight.

[Chemical formula 1]

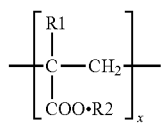

(1)

(Where, R1 is hydrogen or a methyl group and R2 is hydrogen or an alkyl group. X represents an integer.)

Bisphenol type epoxy resin ("jER1006FS" manufactured by Mitsubishi Chemical Corporation)

(Polyrotaxane Resin)

Polyrotaxane ("SH3400P" manufactured by ASM Inc.)

(Curing Agent)

Acid anhydride-based curing agent ("RIKACID TBN-100" manufactured by New Japan Chemical Co., Ltd.)

Carboxylic acid-based curing agent ("TN-1" manufactured by NOF Corporation)

Phenol-based curing agent ("BIOC-E" manufactured by ASAHI YUKIZAI CORPORATION)

Acid anhydride-based curing agent ("H-TM-An" manufactured by Mitsubishi Gas Chemical Company, Inc.)

(Curing Accelerator)

Imidazole ("2PZ-CN" manufactured by SHIKOKU CHEMICALS CORPORATION)

(Surfactant)

Surfactant ("BYK-3440" manufactured by BYK JAPAN KK)

(Inorganic Fine Particles)

Hydrophobic silica subjected to surface treatment ("RX200" manufactured by Nippon Aerosil Co., Ltd.)

(Ultraviolet Absorber)

Ultraviolet absorber ("ULS-1933D" manufactured by LION SPECIALTY CHEMICALS Co., Ltd.)

(Solvent)

Methyl ethyl ketone

<Fabrication of Elastic Resin Sheets 1 to 19>

Resin varnishes 1 to 9 were prepared by adding the blended composition (parts by mass) presented in Table 1 to a solvent (methyl ethyl ketone) so that the solid content in the composition was about 43% by mass. After being left to stand and defoamed, the resin varnishes 1 to 9 were applied to release sheets 1 to 8 subjected to release treatment, respectively, using a bar coater. Next, heating was performed in an oven at 80° C. for 60 minutes to obtain semi-cured resin sheets, and heating was further performed at 180° C. for 120 minutes to obtain resin films (light diffusing films) 1 to 19 of Examples 1 to 13 and Comparative Examples 1 to 6.

The resin varnishes and release sheets used in the respective light diffusing films are as presented in Tables 2 and 3.

The release sheets used are "Coating Mat Release Sheet" manufactured by OHTSUKI INDUSTRIAL CO., LTD., each of which has a specific shape (surface roughness). By using these release sheets 1 to 8, irregularities having Ra1 (arithmetic mean roughness of first surface), Rz1 (maximum height of surface roughness on first surface), Rz2 (maximum height of surface roughness on first surface), and RSm (average length of roughness curve elements) presented in Tables 2 and 3 were formed on the first surface of each film.

For Example 4 and Comparative Example 4, irregularities having Ra2 (arithmetic mean roughness of second surface) presented in Tables 2 and 3 were formed by further bonding a release sheet subjected to release treatment to the second surface of each semi-cured resin sheet and performing press molding.

TABLE 1

| Resin varnish | | Varnish 1 | Varnish 2 | Varnish 3 | Varnish 4 | Varnish 5 | Varnish 6 | Varnish 7 | Varnish 8 | Varnish 9 |
|---|---|---|---|---|---|---|---|---|---|---|
| Epoxy resin | PMS-14-67 EK40 | 89.45 | 90.04 | 96.06 | 97.14 | 85.60 | 87.10 | | 99.08 | |
| | jER1006FS | | | | | | | 18.40 | | 28.43 |
| Polyrotaxane resin | SH3400P | | | | | | | 22.04 | | |
| Curing agent | TBN-100 | 9.13 | | | | 8.74 | 8.89 | | | 13.19 |
| | TN-1 | | 8.58 | | | | | | | |
| | BIOC-E | | | 2.56 | | | | | | |
| | H-TM-An | | | | | | | 3.64 | | |
| Curing accelerator | 2PZ-CN | 0.45 | 0.41 | 0.41 | 1.94 | 0.43 | 0.44 | 0.22 | | 0.42 |
| Surfactant | BYK-3440 | 0.97 | 0.97 | 0.97 | 0.92 | 0.93 | 0.94 | 0.98 | 0.92 | 0.97 |
| Inorganic fine particles | RX200 | | | | | 4.30 | | | | |
| Ultraviolet absorber | ULS-1933D | | | | | | | 2.62 | | |
| Solvent | Methyl ethyl ketone | | | | | | | 54.73 | | 57.00 |

TABLE 2

| | Example 1 | Example 2 | Example 3 | Example 4 | Example 5 | Example 6 | Example 7 |
|---|---|---|---|---|---|---|---|
| Elastic resin sheet | Resin sheet 1 | Resin sheet 2 | Resin sheet 3 | Resin sheet 4 | Resin sheet 5 | Resin sheet 6 | Resin sheet 7 |
| Resin varnish | Varnish 1 | Varnish 1 | Varnish 1 | Varnish 1 | Varnish 1 | Varnish 1 | Varnish 1 |
| Mat release sheet | Sheet 1 | Sheet 2 | Sheet 3 | Sheet 3 | Sheet 3 | Sheet 4 | Sheet 5 |
| t [μm] | 105 | 103 | 107 | 103 | 38 | 109 | 111 |
| Ra1 | 0.5 | 0.3 | 4.8 | 4.8 | 4.8 | 0.3 | 5.0 |
| Ra2 | 0.0 | 0.0 | 0.0 | 4.8 | 0.0 | 0.0 | 0.0 |
| Rz1 | 8.1 | 4.9 | 17.8 | 17.8 | 17.8 | 0.6 | 20.0 |
| Rz2 | 1.2 | 1.1 | 1.2 | 17.8 | 1.1 | 1.3 | 1.3 |
| (Rz1 + Rz2)/t | 0.09 | 0.06 | 0.18 | 0.35 | 0.50 | 0.02 | 0.19 |
| RSm | — | — | — | — | — | 1.2 | 100.0 |

| | Example 8 | Example 9 | Example 10 | Example 11 | Example 12 | Example 13 |
|---|---|---|---|---|---|---|
| Elastic resin sheet | Resin sheet 8 | Resin sheet 9 | Resin sheet 10 | Resin sheet 11 | Resin sheet 12 | Resin sheet 13 |
| Resin varnish | Varnish 2 | Varnish 3 | Varnish 4 | Varnish 5 | Varnish 6 | Varnish 7 |
| Mat release sheet | Sheet 1 | Sheet 1 | Sheet 1 | Sheet 1 | Sheet 1 | Sheet 1 |
| t [μm] | 99 | 101 | 107 | 112 | 102 | 110 |
| Ra1 | 0.5 | 0.5 | 0.5 | 0.5 | 0.5 | 0.5 |
| Ra2 | 0.0 | 0.0 | 0.0 | 0.0 | 0.0 | 0.0 |
| Rz1 | 8.0 | 8.1 | 8.1 | 8.1 | 8.1 | 8.0 |
| Rz2 | 1.2 | 1.2 | 1.1 | 1.2 | 1.2 | 1.3 |
| (Rz1 + Rz2)/t | 0.09 | 0.09 | 0.09 | 0.08 | 0.09 | 0.08 |
| RSm | — | — | — | — | — | — |

TABLE 3

|  | Comparative Example 1 | Comparative Example 2 | Comparative Example 3 | Comparative Example 4 | Comparative Example 5 | Comparative Example 6 |
|---|---|---|---|---|---|---|
| Elastic resin sheet | Resin sheet 14 | Resin sheet 15 | Resin sheet 16 | Resin sheet 17 | Resin sheet 18 | Resin sheet 19 |
| Resin varnish | Varnish 1 | Varnish 1 | Varnish 1 | Varnish 1 | Varnish 8 | Varnish 9 |
| Mat release sheet | Sheet 6 | Sheet 7 | Sheet 8 | Sheet 8 | Sheet 1 | Sheet 1 |
| t [μm] | 103 | 105 | 102 | 101 | 93 | 101 |
| Ra1 | 0.0 | 0.2 | 6.4 | 6.4 | 0.5 | 0.5 |
| Ra2 | 0.0 | 0.0 | 0.0 | 5.2 | 0.0 | 0.0 |
| Rz1 | 1.1 | 3.3 | 26.8 | 26.8 | 8.1 | 8.0 |
| Rz2 | 1.2 | 1.3 | 1.2 | 26.8 | 1.2 | 1.2 |
| (Rz1 + Rz2)/t | 0.02 | 0.04 | 0.27 | 0.53 | 0.10 | 0.09 |
| RSm | — | — | — | — | — | — |

Note that t (resin film thickness), Ra1 (arithmetic mean roughness of first surface), Ra2 (arithmetic mean roughness of second surface), Rz1 (maximum height of surface roughness on first surface), Rz2 (maximum height of surface roughness on first surface), and RSm (average length of roughness curve elements) in Tables 2 and 3 are values measured using a laser microscope ("OLS3000" manufactured by Olympus Corporation).

[Evaluation Test]
<Method for Evaluating Light Transmitting Properties>

A cured product of the light diffusing film in each of Examples and Comparative Examples was attached to a haze meter (NDH7000SP II manufactured by NIPPON DENSHOKU INDUSTRIES Co., Ltd.), and the total light transmittance was measured under conditions conforming to ASTM D1003. As the evaluation of light transmitting properties, a total light transmittance of 90% or more was evaluated as "excellent", a total light transmittance of 80% or more and less than 90% was evaluated as "good", and a total light transmittance of less than 80% was evaluated as "poor".

<Method for Evaluating Light Diffusibility>

A cured product of the light diffusing film in each of Examples and Comparative Examples was attached to a haze meter (NDH7000SP II manufactured by NIPPON DENSHOKU INDUSTRIES Co., Ltd.), and the haze value was measured under conditions conforming to ASTM D1003. As the evaluation of light diffusibility, a haze value of 80 or more was evaluated as "excellent", a haze value of 50 or more and less than 80 was evaluated as "good", and a haze value of less than 50 was evaluated as "poor".

<Method for Evaluating Flexibility and Extensibility>

The light diffusing film in each of Examples and Comparative Examples was cut into a strip of 150 mm*5.5 mm and attached to a universal testing machine (AGS-X manufactured by Shimadzu Corporation). The test was conducted at a tension speed of 500 mm/min, the slope of r-σ was determined from all the stress (a) data corresponding to the strain (r) at 1% and 5% elongation of the light diffusing film by the least squares method, and the initial tensile modulus was calculated.

Strain($r$)=$x/x0$ ($x$ is gripper moving distance, $x0$ is initial distance between grippers)

Stress (σ)=$F/(d \cdot l)$ ($F$ is test force, $d$ is film thickness, and $l$ is width of test piece)

As the evaluation of flexibility, an initial tensile modulus of less than 50 MPa was evaluated as "excellent", an initial tensile modulus of 50 MPa or more and less than 500 MPa was evaluated as "good", and an initial tensile modulus of 500 MPa or more was evaluated as "poor".

The elongation rate when each cured resin film was broken was measured. For the evaluation of extensibility, an elongation at break of 100% or more was evaluated as "excellent", an elongation at break of 50% or more and less than 100% was evaluated as "good", and an elongation at break of less than 50% was evaluated as "poor".

<Method for Evaluating Heat Resistance>

The light diffusing film in each of Examples and Comparative Examples was cut to 10 mm×30 mm and attached to a dynamic viscoelasticity measuring instrument (DMS6100 manufactured by Seiko Instruments Inc.). The test was conducted at a strain amplitude of 10 μm, a frequency of 10 Hz (sine wave), and a rate of temperature increase of 5° C./min, and the storage modulus at 250° C. was measured. As the evaluation of heat resistance, a case where the storage modulus was 0.1 MPa or more was judged as acceptable, and a case where the storage modulus was less than 0.1 MPa was judged as unacceptable.

The above results are summarized in Tables 4 and 5.

TABLE 4

|  | Example 1 | Example 2 | Example 3 | Example 4 | Example 5 | Example 6 | Example 7 |
|---|---|---|---|---|---|---|---|
| Total light transmittance [%] | 91.1 (excellent) | 92.1 ((excellent)) | 85.1 (good) | 81.1 (good) | 86.4 (good) | 92.2 ((excellent)) | 83.8 (good) |
| HAZE [%] | 83.9 ((excellent)) | 83.1 ((excellent)) | 88.4 ((excellent)) | 87.9 ((excellent)) | 87.3 ((excellent)) | 55.9 (good) | 86.1 (excellent) |
| Initial modulus [MPa] | 132.1 (good) | 130.3 (good) | 125.3 (good) | 133.4 (good) | 129.0 (good) | 130.8 (good) | 133.1 (good) |
| Elongation at break [%] | 84.3 (good) | 90.4 (good) | 81.1 (good) | 69.3 (good) | 88.4 (good) | 85.2 (good) | 63.5 (good) |
| 250° C. storage modulus [MPa] | 1.8 | 1.7 | 1.8 | 1.8 | 1.6 | 1.8 | 1.8 |

TABLE 4-continued

|  | Example 8 | Example 9 | Example 10 | Example 11 | Example 12 | Example 13 |
|---|---|---|---|---|---|---|
| Total light transmittance [%] | 91.3 (excellent) | 91.0 (excellent) | 91.1 (excellent) | 83.3 (good) | 90.9 (excellent) | 91.1 (excellent) |
| HAZE [%] | 84.0 (excellent) | 83.3 (excellent) | 82.8 (excellent) | 89.5 (excellent) | 83.3 (excellent) | 83.8 (excellent) |
| Initial modulus [MPa] | 93.5 (good) | 121.2 (good) | 0.5 (excellent) | 173.1 (good) | 118.7 (good) | 7.4 (good) |
| Elongation at break [%] | 128.4 (excellent) | 79.2 (good) | 223.8 (excellent) | 52.3 (good) | 85.0 (good) | 184.3 (excellent) |
| 250° C. storage modulus [MPa] | 1.6 | 1.9 | 1.1 | 2.0 | 1.7 | 1.2 |

TABLE 5

|  | Comparative Example 1 | Comparative Example 2 | Comparative Example 3 | Comparative Example 4 | Comparative Example 5 | Comparative Example 6 |
|---|---|---|---|---|---|---|
| Total light transmittance [%] | 92.5 (excellent) | 92.2 (excellent) | 78.9 (poor) | 75.2 (poor) | 91.5 (excellent) | 91.2 (excellent) |
| HAZE [%] | 11.4 (poor) | 39.2 (poor) | 87.7 (excellent) | 91.1 (excellent) | 81.6 (excellent) | 81.1 (excellent) |
| Initial modulus [MPa] | 133 (good) | 126.8 (good) | 130.9 (good) | 128.4 (good) | 0.2 (excellent) | 521.5 (poor) |
| Elongation at break [%] | 82.1 (good) | 84.7 (good) | 49.4 (poor) | 30.3 (poor) | 384.2 (excellent) | 18.3 (poor) |
| 250° C. storage modulus [MPa] | 1.7 | 1.8 | 1.7 | 1.7 | Equal to or below measurement limit | 118.2 |

(Discussion)

As is clear from the results in Table 4, it was confirmed that the elastic resin sheets of the present invention exhibit light diffusibility, flexibility and heat resistance, and is less likely to break during stretching.

On the other hand, as presented in Table 5, in the films of Comparative Examples 1 and 2 in which the first and second surfaces do not have the desired roughness, sufficient light diffusibility cannot be acquired.

In the resin sheets of Comparative Examples 3 and 4, the arithmetic mean surface roughness Ra and the maximum height of surface roughness Rz are out of the stipulated ranges, and as a result, light transmitting properties are inferior. In particular, the resin sheet of Comparative Example 4 does not satisfy the stipulation for Rz on the first surface and the second surface, is thus inferior in extensibility, and breaks immediately.

In Comparative Example 5, a resin sheet fabricated using a resin composition that does not contain a curing agent is used, and thus heat resistance cannot be acquired.

The resin sheet of Comparative Example 6 has an initial tensile modulus of more than 500 MPa, is thus inferior in extensibility, and breaks immediately.

This application is based on Japanese Patent Application No. 2021-69766 filed on Apr. 16, 2021, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

The present invention has wide industrial applicability in technical fields such as electronic materials, electronic devices, and optical devices.

The invention claimed is:

1. An elastic resin sheet that is a resin sheet formed using a resin composition containing a thermosetting resin including an epoxy resin and a curing agent, wherein:
when a maximum height of a surface roughness on a first surface of the resin sheet is Rz1 (μm), a maximum height of a surface roughness on a second surface facing the first surface is Rz2 (μm), and a thickness is t (μm), the Rz1, the Rz2, and the thickness t (μm) satisfy relation of the following Formula (1):

$$(Rz1+Rz2)/t \leq 0.5 \tag{1}$$

the elastic resin sheet comprises a light-diffusing portion having irregularities with an arithmetic mean roughness Ra of 0.3 μm or more and 5.0 μm or less on at least one of the first surface and the second surface, and
the elastic resin sheet has an initial tensile modulus of 0.5 MPa or more and 500 MPa or less.

2. The elastic resin sheet according to claim 1, wherein an average length RSm of roughness curve elements in the irregularities is 1.0 μm or more and 100 μm or less.

3. The elastic resin sheet according to claim 1, wherein the epoxy resin contains two or more epoxy groups in one molecule and has a molecular weight of 500 or more.

4. The elastic resin sheet according to claim 1, wherein the resin composition further comprises a curing accelerator.

5. The elastic resin sheet according to claim 1, further comprising inorganic fine particles.

6. The elastic resin sheet according to claim 1, further comprising an ultraviolet absorber.

7. The elastic resin sheet according to claim 1, wherein the Rz1 is greater than the Rz2.

8. The elastic resin sheet according to claim 7, wherein the Rz2 is in a range from 1.1 to 1.3.

9. The elastic resin sheet according to claim 7, wherein the Rz1 is in a range from 8.0 to 20.0.

10. The elastic resin sheet according to claim 1, wherein the t is in a range from 30 to 150.

11. The elastic resin sheet according to claim 1, wherein $0.02 \leq (Rz1+Rz2)/t \leq 0.35$ is satisfied.

12. The elastic resin sheet according to claim 1, wherein an amount of the epoxy resin is 50 to 99 parts by mass with respect to a total amount of the resin composition.

13. The elastic resin sheet according to claim 12, wherein an amount of the curing agent is 1 to 50 parts by mass with respect to the total amount of the resin composition.

14. The elastic resin sheet according to claim 1, wherein the resin composition further comprises polyrotaxane.

15. A light-emitting sheet comprising:
   a fiber sheet;
   a conductor layer laminated on the fiber sheet;
   an LED electrically connected to the conductor layer; and
   a light diffusing layer including an elastic resin sheet and covers the LED, wherein:
   the elastic resin sheet that is a resin sheet formed using a resin composition containing a thermosetting resin including an epoxy resin and a curing agent,
   when a maximum height of a surface roughness on a first surface of the resin sheet is Rz1 (μm), a maximum height of a surface roughness on a second surface facing the first surface is Rz2 (μm), and a thickness is t (μm), the Rz1, the Rz2, and the thickness t (μm) satisfy relation of the following Formula (1):

$$(Rz1+Rz2)/t \leq 0.5 \qquad (1)$$

the elastic resin sheet comprises a light-diffusing portion having irregularities with an arithmetic mean roughness Ra of 0.3 μm or more and 5.0 μm or less on at least one of the first surface and the second surface, and
   the elastic resin sheet has an initial tensile modulus of 0.5 MPa or more and 500 MPa or less.

16. The light-emitting sheet according to claim 15, wherein the fiber sheet includes a fiber layer and a resin layer, can be elongated by 1% or more, and has an initial tensile modulus of 1 MPa or more and 10 GPa or less.

* * * * *

UNITED STATES PATENT AND TRADEMARK OFFICE
CERTIFICATE OF CORRECTION

PATENT NO. : 12,031,708 B2  
APPLICATION NO. : 18/376702  
DATED : July 9, 2024  
INVENTOR(S) : Tomohiro Fukao et al.

Page 1 of 1

It is certified that error appears in the above-identified patent and that said Letters Patent is hereby corrected as shown below:

On the Title Page

Under Item (54), and in the Specification, Column 1, Lines 1-4, the title should be:
ELASTIC RESIN SHEET HAVING LIGHT-DIFFUSING PORTION, AND LIGHT-EMITTING SHEET USING SAME

Signed and Sealed this  
Eleventh Day of February, 2025

Coke Morgan Stewart  
*Acting Director of the United States Patent and Trademark Office*